(12) United States Patent
Nag et al.

(10) Patent No.: US 7,786,376 B2
(45) Date of Patent: Aug. 31, 2010

(54) HIGH EFFICIENCY SOLAR CELLS AND MANUFACTURING METHODS

(75) Inventors: Somnath Nag, Saratoga, CA (US); Mehrdad Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 216 days.

(21) Appl. No.: 11/841,629

(22) Filed: Aug. 20, 2007

(65) Prior Publication Data

US 2008/0047601 A1    Feb. 28, 2008

Related U.S. Application Data

(60) Provisional application No. 60/823,200, filed on Aug. 22, 2006.

(51) Int. Cl.
*H01L 31/04* (2006.01)
*H01L 21/00* (2006.01)

(52) U.S. Cl. .................................. 136/255; 438/57
(58) Field of Classification Search .................. 136/244, 136/252, 255; 438/57, 73, 92; 257/449–457, 257/E31.065, E31.074
See application file for complete search history.

(56) References Cited

U.S. PATENT DOCUMENTS 5,538,564 A * 7/1996 Kaschmitter ................ 136/255

OTHER PUBLICATIONS

Lammert et al., The interdigitated back contact solar cell: a silicon solar cell for use in concentrated sunlight, IEEE Transactions on Electron Devices, Apr. 1977, pp. 337-342.*

* cited by examiner

*Primary Examiner*—Kevin P Kerns
*Assistant Examiner*—Kevin E Yoon
(74) *Attorney, Agent, or Firm*—Hulsey, P.C.; William N. Hulsey, III

(57) ABSTRACT

A Schottky contact photovoltaic energy conversion cell. The Schottky contact photovoltaic energy conversion cell comprises a flexible substrate and a first array of a plurality of closely-spaced microscale pillars connected to a first electrical cell contact. The pillars and the contact are formed of (or having a top) layer of a first Schottky metal material with a work function selected for efficiently collecting photogenerated electrons. The Schottky contact photovoltaic energy conversion cell further comprises a second array of a plurality of closely-spaced microscale pillars connected to a second electrical cell contact. The pillars and the contact are formed of (or having a top) layer of a second Schottky metal material with a work function selected for efficiently collecting photogenerated holes. The Schottky contact photovoltaic energy conversion cell further comprises a semiconductor absorber thin-film layer covering the first and second contacts and filling spaces among all the pillars, for creating photogenerated electrons and holes.

6 Claims, 17 Drawing Sheets

Completed cell structure - Side view

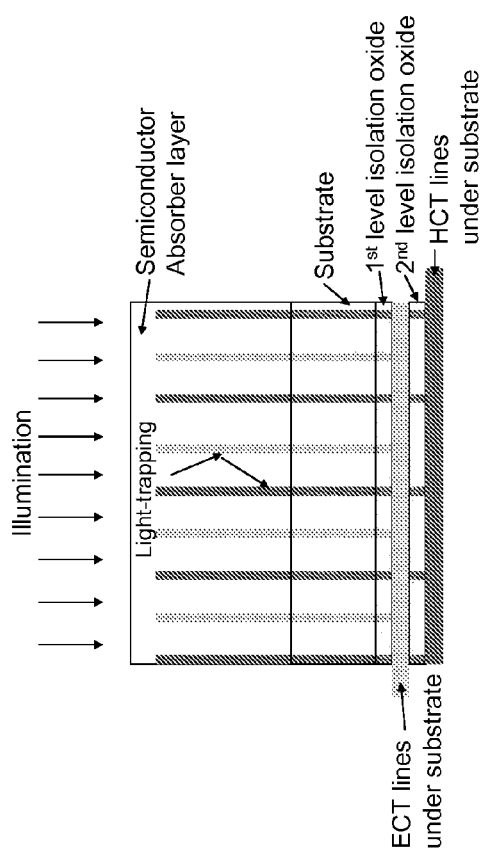
Fig 1a. Completed cell structure – Side view
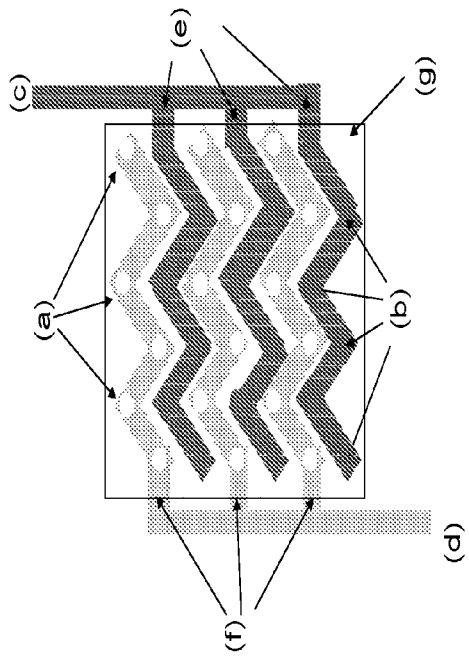
Fig 1b. Completed cell structure – Top View

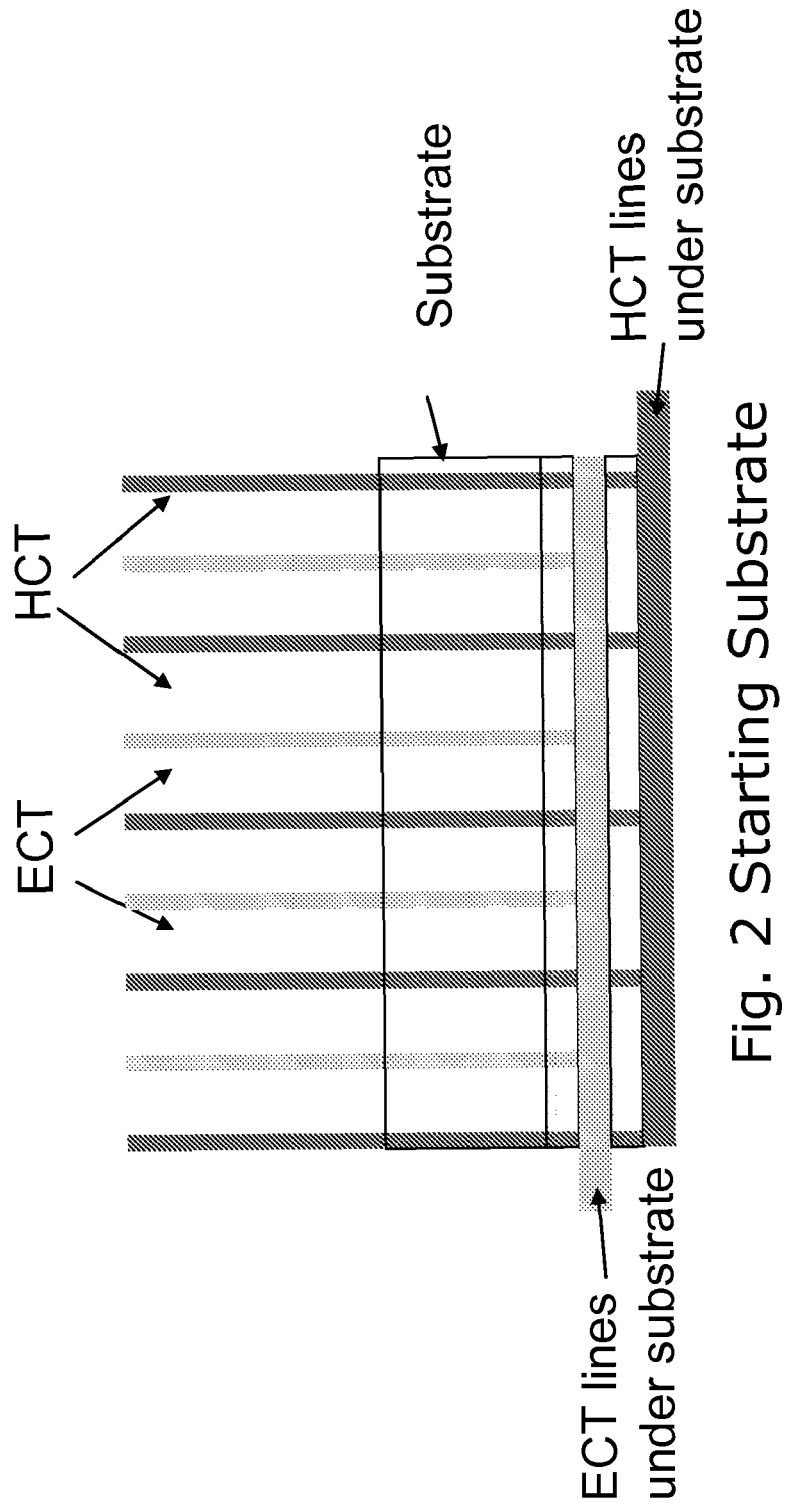
Fig. 2 Starting Substrate

HIGH EFFICIENCY SOLAR CELLS AND MANUFACTURING METHODS This application claims the benefit of provisional patent application 60/823,200 filed on Aug. 22, 2006, which is hereby incorporated by reference.

FIELD

This disclosure relates in general to the field of solar cells, and more particularly to high efficiency solar cells and methods of manufacturing same.

DESCRIPTION OF THE RELATED ART

One of the key limitations to the wide-spread implementation of solar cells is their relatively low conversion efficiency (and another limitation is a relatively high manufacturing cost). As a result, the cost/watt of commercial photovoltaics is not competitive with fossil fuels and various conventional forms of grid-distributed electricity. There are a number of ways to increase cell efficiency through innovations in materials and cell designs. This disclosure discloses a specific thin-film solar cell and manufacturing method in order to mass produce high-efficiency, cost-reduced solar cells and modules.

Large scale implementation of commercial photovoltaics as a sustainable energy source has been plagued by its economics that are not yet fully cost-competitive with conventional energy sources. The PV market today is dominated by 5" single-crystal silicon wafers which are used to fabricate solar cells using either top/bottom contacts or bottom contacts only. Typical cell efficiencies are in the range of 13%-18%. However, the cost of single crystal silicon has remained high while supplies have tightened due to increasing demand from the IC industry.

In order to address this problem, there has been progress made in lowering cost by the development of deposited semiconductor thin film PV technology primarily by innovation in new materials such as Copper-Indium-Gallium-Selenide (CIGS), Cadmium Telluride (CdTe), and novel processing techniques such as CVD, PVD and solution-based techniques. While these $2^{nd}$ generation thin-film PV cells are promising, their efficiencies are still in the range of 10%-13%, thus still not making them a compelling replacement for the expensive but dominant single-crystal silicon cells. Further improvements are required to significantly increase the efficiency of thin-film PV cells, while reducing their cost/watt.

SUMMARY

In accordance with the present disclosure, a high efficiency solar cell and method of manufacturing same are provided.

According to one aspect of the disclosed subject matter, there is provided a Schottky contact photovoltaic energy conversion cell. The Schottky contact photovoltaic energy conversion cell includes a flexible substrate and a first array of a plurality of closely-spaced microscale pillars connected to a first electrical cell contact. The pillars and the contact are formed of (or having a top) layer of a first Schottky metal material with a work function selected for efficiently collecting photogenerated electrons. The Schottky contact photovoltaic energy conversion cell further includes a second array of a plurality of closely-spaced microscale pillars connected to a second electrical cell contact. The pillars and the contact are formed of (or having a top) layer of a second Schottky metal material with a work function selected for efficiently collecting photogenerated holes. The Schottky contact photovoltaic energy conversion cell further includes a semiconductor absorber thin-film layer covering the first and second contacts and filling spaces among all the pillars, for creating photogenerated electrons and holes.

According to another aspect of the disclosed subject matter, there is provided a method to manufacture a Schottky contact photovoltaic energy conversion cell. The method includes using a roll of a flexible substrate material moving between an input substrate feeder and an output substrate receiver through a continuous flow in-line cell factory. The method further includes using a sequence of substrate processing tools within said in-line cell factory, said tools comprising physical-vapor deposition, metal plating, and pattern transfer equipment. The material roll goes through a process sequence to form interdigitated arrays of Schottky-barrier lines and pillars covered with a semiconductor absorber layer.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages be included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference characters identify correspondingly throughout and wherein:

FIG. 1a shows a side view of a completed cell structure;

FIG. 1b shows a top view of a completed cell structure;

FIG. 2 shows a starting substrate;

Figure 6:
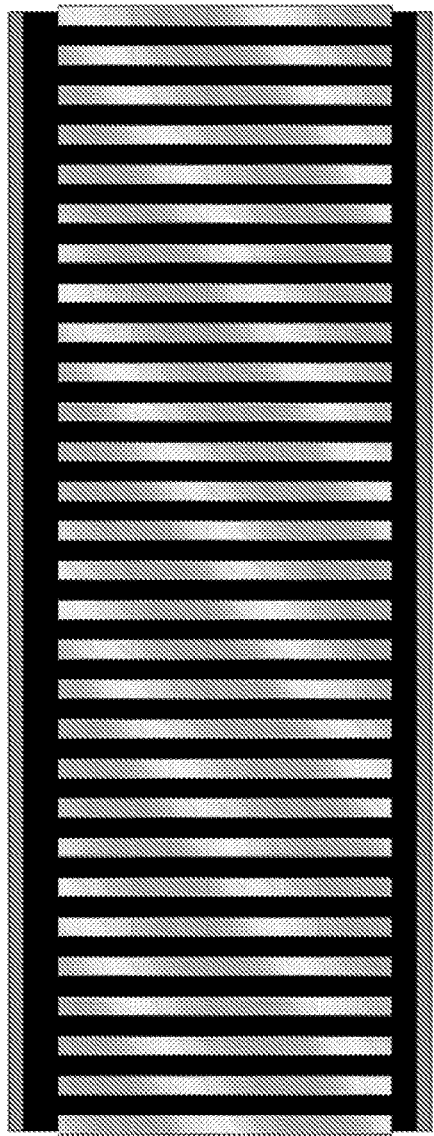
FIG. 6 shows a schematic diagram of a section of the flexible substrate after a first focused oxygen beam process.
Figure 7:
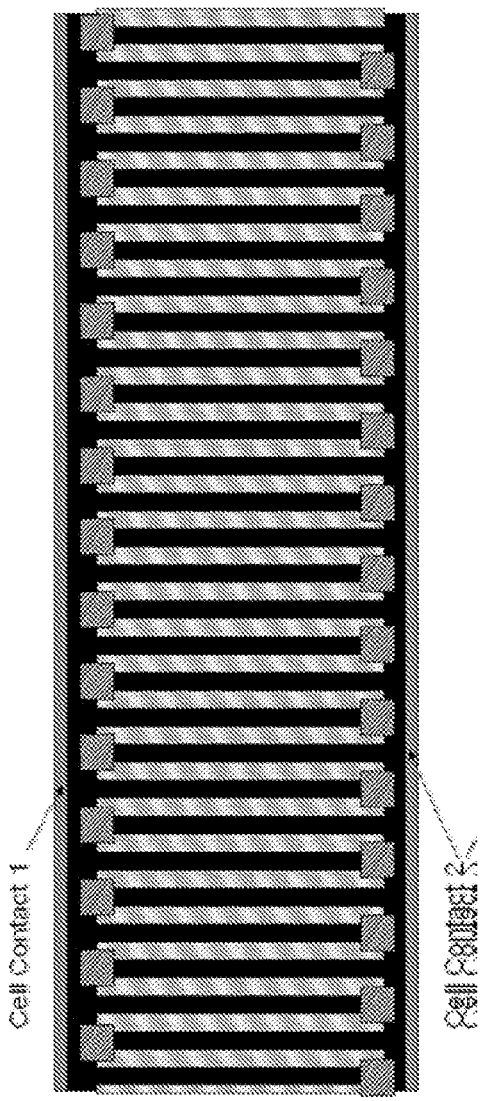
FIG. 7 shows a schematic diagram of a section of the flexible substrate after a second focused oxygen beam process.
Figure 8:
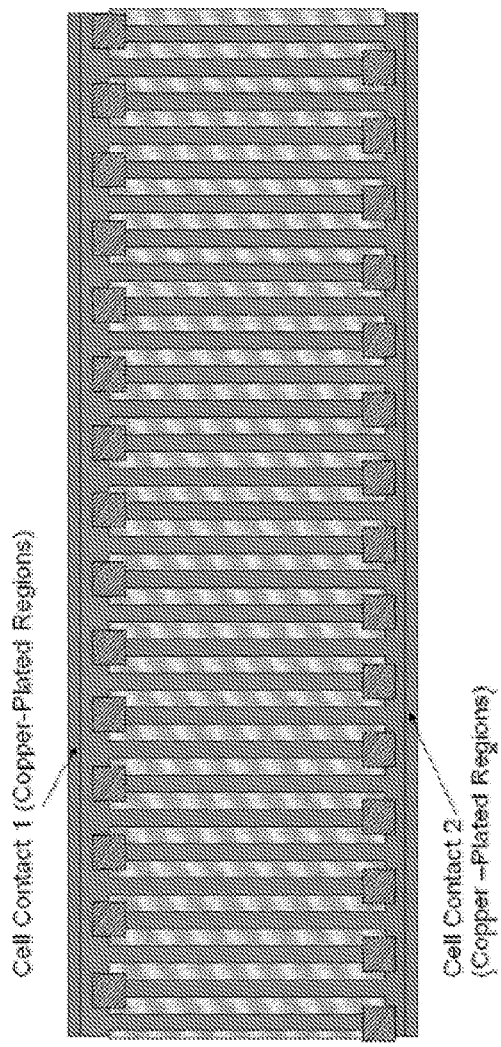
FIG. 8 shows a schematic diagram of a section of the flexible substrate after a plating process.
Figure 9:
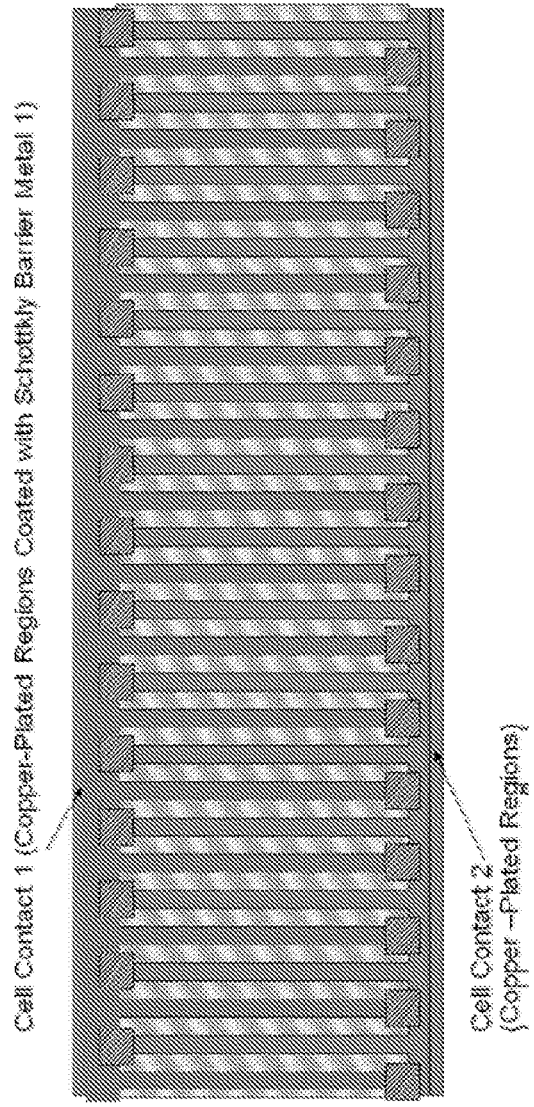
FIG. 9 shows a schematic diagram of a section of the flexible substrate after a selective biased electroplating process.
Figure 10:
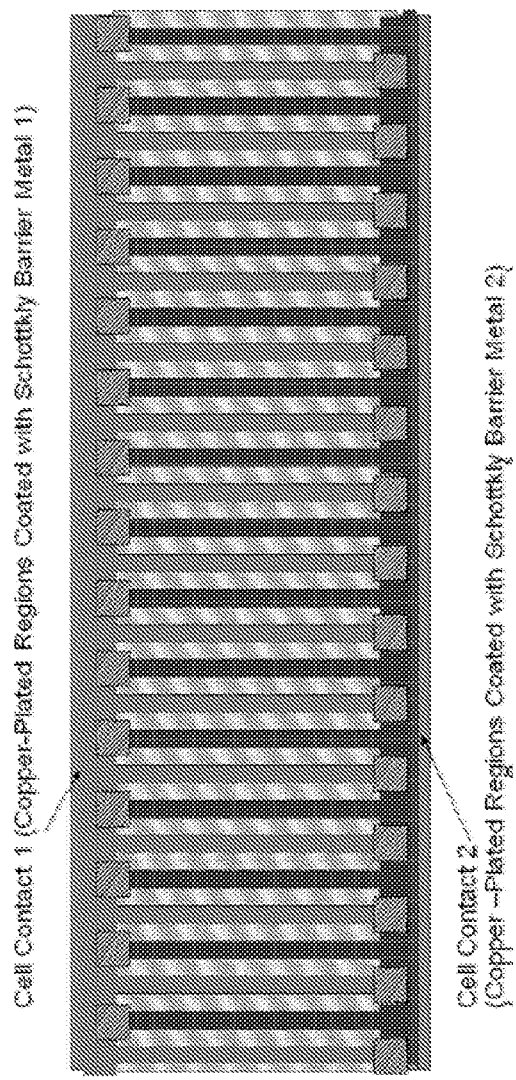
FIG. 10 shows a schematic diagram of a section of the flexible substrate after another selective biased electroplating process.
Figure 12:
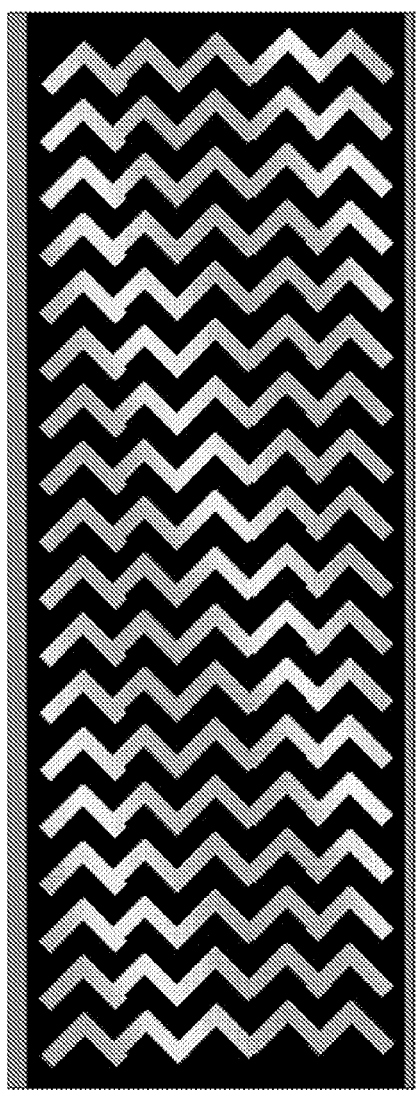
Figure 13:
Figure 14:
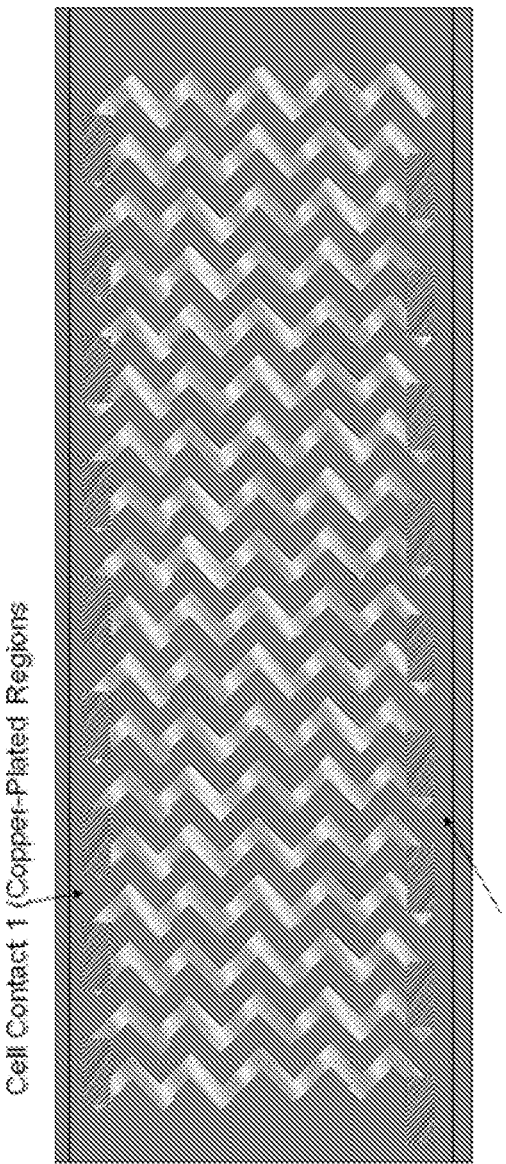
Figure 15:
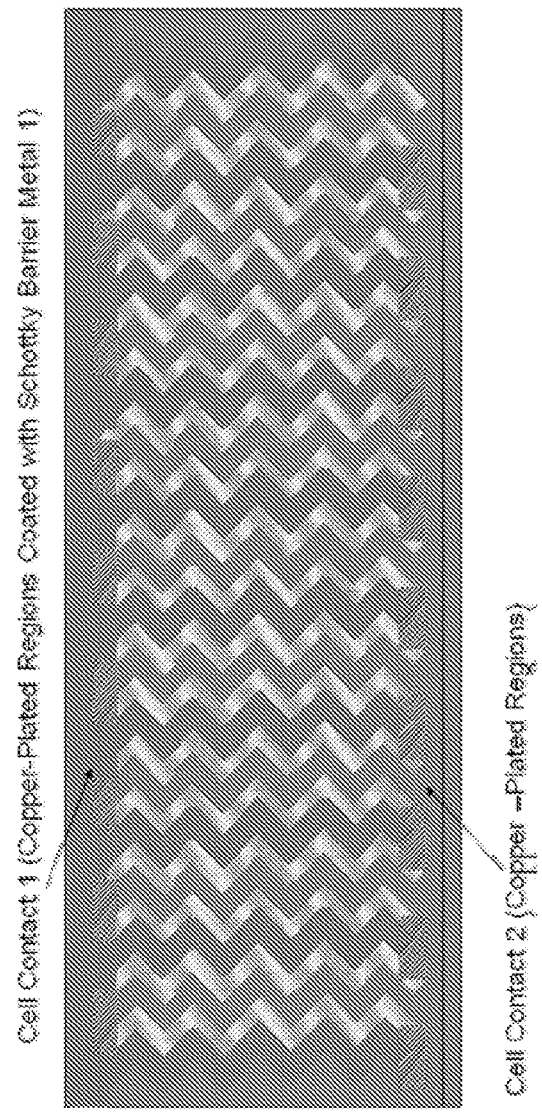
Figure 16:
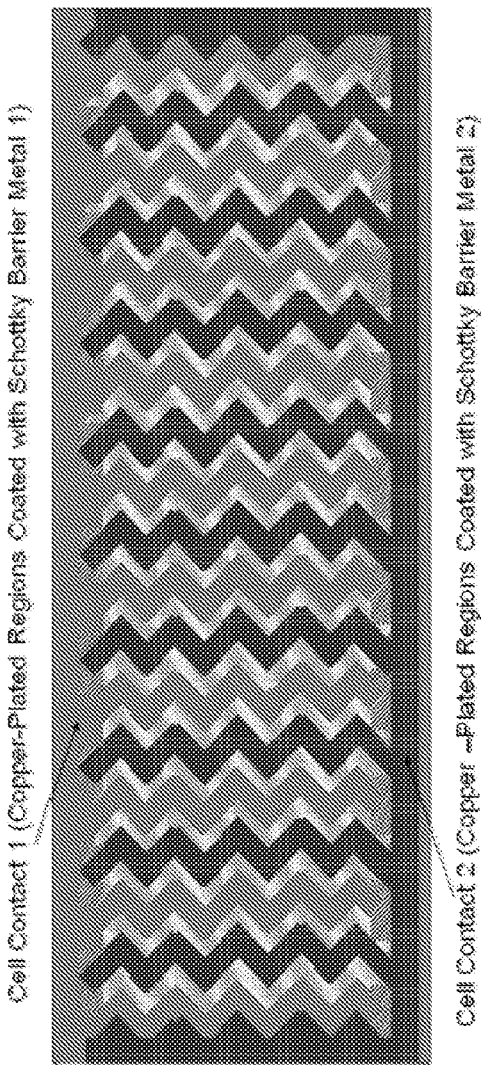

FIG. 12 corresponds to FIG. 6 for the straight interdigitated lines;

FIG. 13 corresponds to FIG. 7 for the straight interdigitated lines;

FIG. 14 corresponds to FIG. 8 for the straight interdigitated lines;

FIG. 15 corresponds to FIG. 9 for the straight interdigitated lines;

FIG. 16 corresponds to FIG. 10 for the straight interdigitated lines; and

Figure 11:
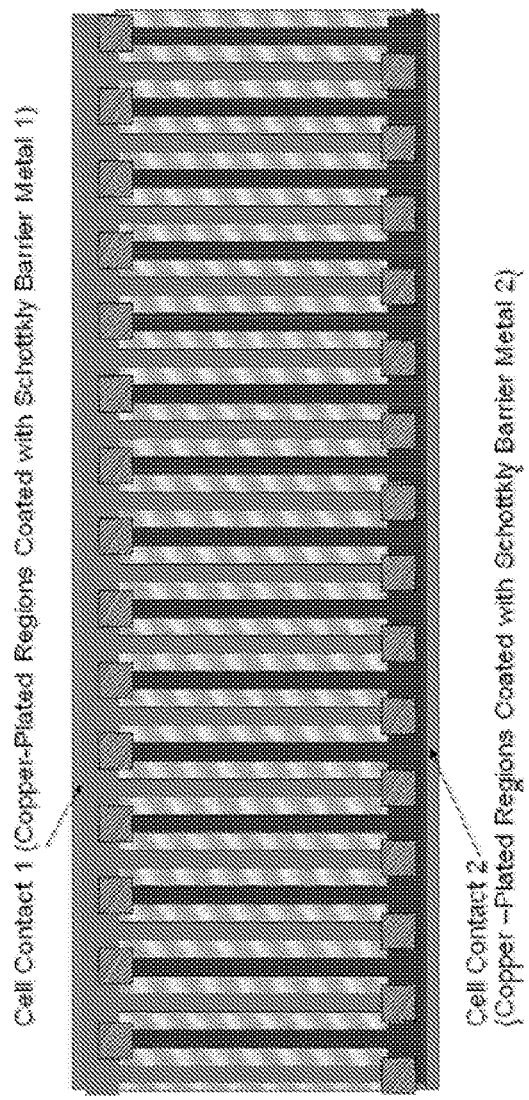
FIG. 11 shows a schematic diagram of a section of the flexible substrate after deposition of a semiconductor absorber layer.
Figure 17:
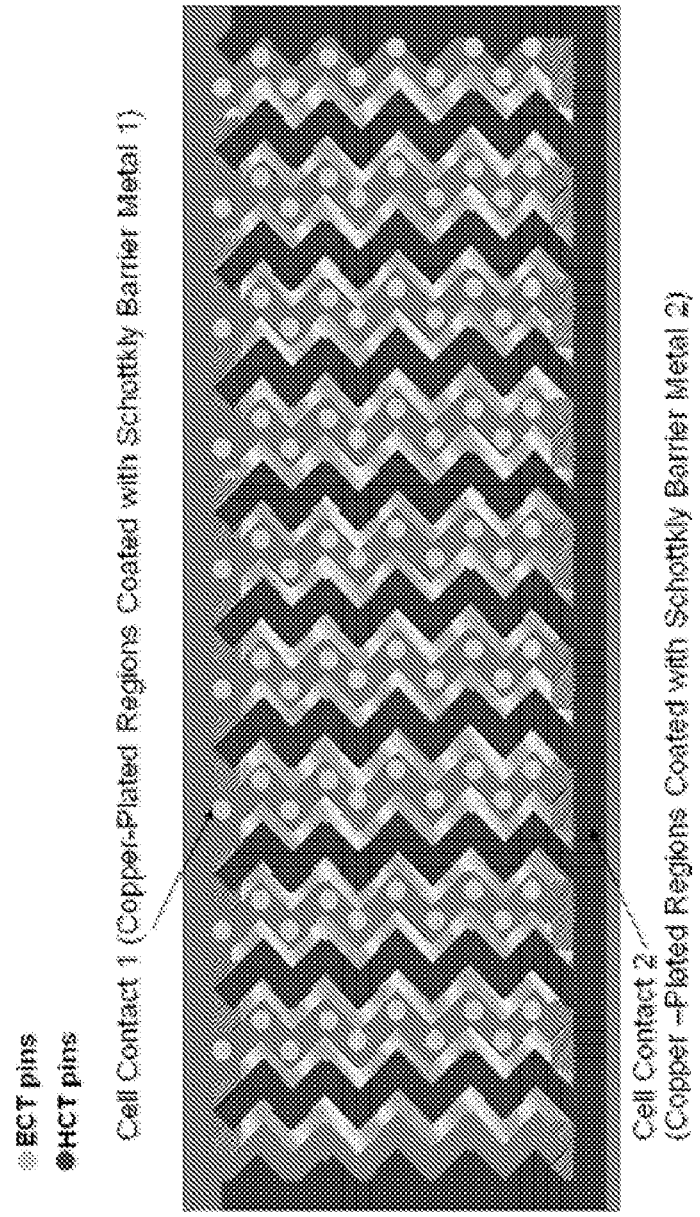

FIG. 17 corresponds to FIG. 11 for the straight interdigitated lines.

DETAILED DESCRIPTION OF THE SPECIFIC EMBODIMENTS

The following description is not to be taken in a limiting sense, but is made for the purpose of describing the general principles of the disclosure. The scope of the disclosure should be determined with reference to the claims.

The problem described above is addressed through an innovative cell design which improves efficiency by 2 means: 1) enhanced light-trapping and 2) enhanced carrier collection. The basic cell design takes advantage of the simplicity of a Schottky junction as opposed to a more complex p-i-n diode.

The preferred embodiment of the cell structure of this disclosure is shown in FIGS. 1a, 1b. It consists of a flexible substrate on which are fabricated contact pins in a pattern which alternates electron collection terminals (ECT) with hole collection terminals (HCT) such that each ECT is symmetrically surrounded by a number of HCTs and vice-versa, as shown in FIG. 2. The ECTs and HCTs are electrically isolated from each other at the substrate, while the groups of ECTs and HCTs are each electrically tied together to a common n-bus and p-bus respectively. The height of all pins is shown the same here and determined by the thickness of semiconductor film that will be deposited to form the cell (although the thickness of the semiconductor layer may be larger than the height of the pins). However, the pin heights may vary across the same substrate if the cell design requires it. The n- and p-bus lines have to be designed appropriately as shown in FIG. 2 in order to effectively collect generated photo-current without cross-talk between opposing electrodes. Alternate patterns of the pin placement such as interdigitated straight line arrays are also possible.

The relative work-functions of the metals used at the two electrodes will determine the built-in potential ($V_{bi}$) available for collection of photo-generated carriers as well as the open circuit voltage ($V_{oc}$) of the cell. For instance, the work function of Pt is 5.65 eV while that of In is 4.12 eV. Thus for a system that includes Pt and In as the two contact metals, a $V_{bi}$ of ~1.53 eV would result.

The local metal barrier heights at each contact will influence the ability to inject carriers across the metal-semiconductor Schottky junction. The material for the ECT may be chosen such that its barrier height for electrons is low while the material for the HCT may be chosen such that its barrier height for holes is low, at the interface of the semiconductor material selected as the absorber layer. However, this is not an absolute requirement since the carrier transport across these local Schottky junctions may be controlled by using a combination of surface pre-treatments, layers formed due to reaction between the metal & semiconductor (such as silicidation), insulating layers and doped layers which have been shown to control the effective barrier and/or create tunneling contacts. Similarly, pairs of metals may be chosen for optimal $V_{bi}$ and carrier-transport across the contacts.

The spacing between the contact pins is chosen such that there is a large enough built-in electric field $E_{bi}$ that will sweep photo-generated carriers towards the contacts for collection. Additionally, the engineering of barrier heights at each contact will ensure that reverse leakage currents are minimized. The pins may be of an optimum diameter such that their resistance is low, their fabrication is easy and that they occupy minimum "effective floor-space" on the substrate. Moreover, the surface finish of the pins is controlled to provide a reflective surface off which the incident illumination may bounce off and result in a light-trapping environment. The surface of the metal contact pins may be further textured to create a diffused reflective surface such that there is maximum optical enhancement of the incident radiation. The preparation of the substrate is a key step in the fabrication of this high-efficiency cell.

The next step in the cell fabrication process is deposition of the semiconducting absorber thin film material. This may be done using a variety of processes including but not restricted to CVD, PVD, solution-based (e.g., plating) and others. The thin-film materials deposited could include but are not restricted to polycrystalline-Si, amorphous-Si, CIGS, Cd—Te and others. Thin films formed in this method may be further processed after deposition using thermal or other treatments to modify the material from say an amorphous to a polycrystalline and other morphologies. Again, thickness of the deposited film is large enough to completely cover the tops of the contact pins described earlier but should be limited to a value which allows the top surface of the deposited film to be within the fringing electric field between the tips of any two adjacent contact pins. This will ensure that the photo-generated carriers are efficiently collected at the terminals. See FIG. 1a.

The cell described above has the following features and advantages: a) the absence of top contacts allows the full illumination to be incident on the entire cell area thus generating photo-carriers over the entire area of the cell b) the contact pins that traverse almost the entire film thickness have multiple advantages: i) an electric field is formed between each set of nearest-neighbor pins which sweeps photo-carriers (under drift) into the contacts, irrespective of the depth into the thin-film that the carriers are generated. The advantage is that the collection contacts are present at every point along the thickness of the PV film. As long as the spacing between the contact pins is maintained low enough to have a strong enough electric field between the pins, the carriers generated anywhere along the film thickness will be collected with minimal recombination losses. This feature eliminates the problem faced by most solar cells where the contacts are either in the front or back of the cell, and where the carriers have to move to the contacts by diffusion. During diffusion, many of the carriers may be lost by mechanisms such as recombination and trapping. ii) Additionally, this cell structure does not restrict the thickness of semiconductor film that may be used. The two typical opposing constraints on film thickness are: 1) the film has to be thick enough to absorb as much of the incident radiation as possible and 2) the film has to be thin enough such that carriers generated far from the contacts may diffuse or drift under an E-field and be collected at the contacts. In the case of the cell in this disclosure, for a given absorber layer, one may calculate the thickness of film required to absorb the illumination spectrum, and then design the film thickness to achieve essentially ~100% absorption of the solar photons with energies above the absorber bandgap energy. Even for direct bandgap amorphous or polycrystalline PV materials, it is not possible to indefinitely increase absorber layer thickness since usually the defect density of these semiconductors may be high, including a large density of defect-induced states in the bandgap which severely impedes carrier collection due to recombination and trapping centers.

Moreover, the film thickness may also be determined based on any cell area constraint. Effectively, if carriers may be collected at their point of photo-generation as in this cell, one only needs to calculate a volumetric photo-generation needed to satisfy a cell current-output requirement. In principle, for a constraint on the cell/panel footprint, one may simply increase the absorber film thickness (and contact pin height) to compensate for loss of cell area. 3) There is an additional benefit from this minimization of footprint of each cell. Even if the $V_{oc}$ is low for each double Schottky MIM cell, since the footprint of such cells may be minimized, many more cells may be connected in series in a panel to get the desired output voltage for each panel.

The presence of contact pins in the cell volume will provide a light-trapping environment where light will bounce off these pins and have a longer effective path length through the absorber layer, thereby resulting in higher cell efficiency.

As discussed above, the interfaces of the Schottky contacts where the semiconductor absorber material contacts the metal pins, may be engineered to provide low resistance and recombination losses. One methodology may be to include thin interface layers that accomplish these effects. Generally, Schottky interfaces may be unreliable over time due to unstable native oxides that unintentionally form over metal electrodes. In order to avoid this uncertainty, controlled surfaces may be formed either by eliminating residual oxides from the electrode surfaces before the photovoltaic semiconductor is deposited or by creating controlled amounts of oxide layers that do not have time-dependent behavior.

The back interface of the cell i.e. the upper surface of the substrate may be textured to further create a light trapping surface to ensure maximum absorption of illumination. Similarly the upper surface of the cell may be prepared to maximize light absorption by texturing and use of anti-reflective layers.

These cells are expected to show significant improvements in conversion efficiency over current generation of thin-film cells such as those made of amorphous silicon, amorphous/microcrystalline silicon, CIGS, and CdTe. As expected, the cost of materials may be made lower than that of standard wafer-based single-crystal Si cells. These features should allow this cell to be a best-of-breed thin-film PV solution in terms of $/watt which would make it cost-effective for large-scale implementation. Preliminary device simulations using a numerical device model, indicates that the overall external quantum efficiency (collection efficiency) significantly improves over a standard p-i-n junction cell. This improvement is primarily due to the ability to use absorber with low effective layer thicknesses i.e., the spacing between the collection pins, in the case of the cell in this disclosure.

FIG. 1a shows a side view of a completed cell structure.
FIG. 1b shows a top view of a completed cell structure.
FIG. 2 shows a starting substrate.

The same concept above may be applied towards building p-i-n PV cells by adding a coating of p/p+ of the semiconductor material on the HCT and by adding a coating of n/n+ of the semiconductor material on the ECT. These additional coatings on the HCT and ECT pins may be applied ex-situ before assembling the substrate and depositing the absorber i-layer material to build up the cell.

The application of this cell structure may be used for other photonic devices such as detectors. Other manifestations of this vertical junction PV cell concept could include parallel plate electrodes which had semiconductor layers alternating in between such that there would be an existing strong E-field in the region where the carriers are being photo-generated.

Figure 3:
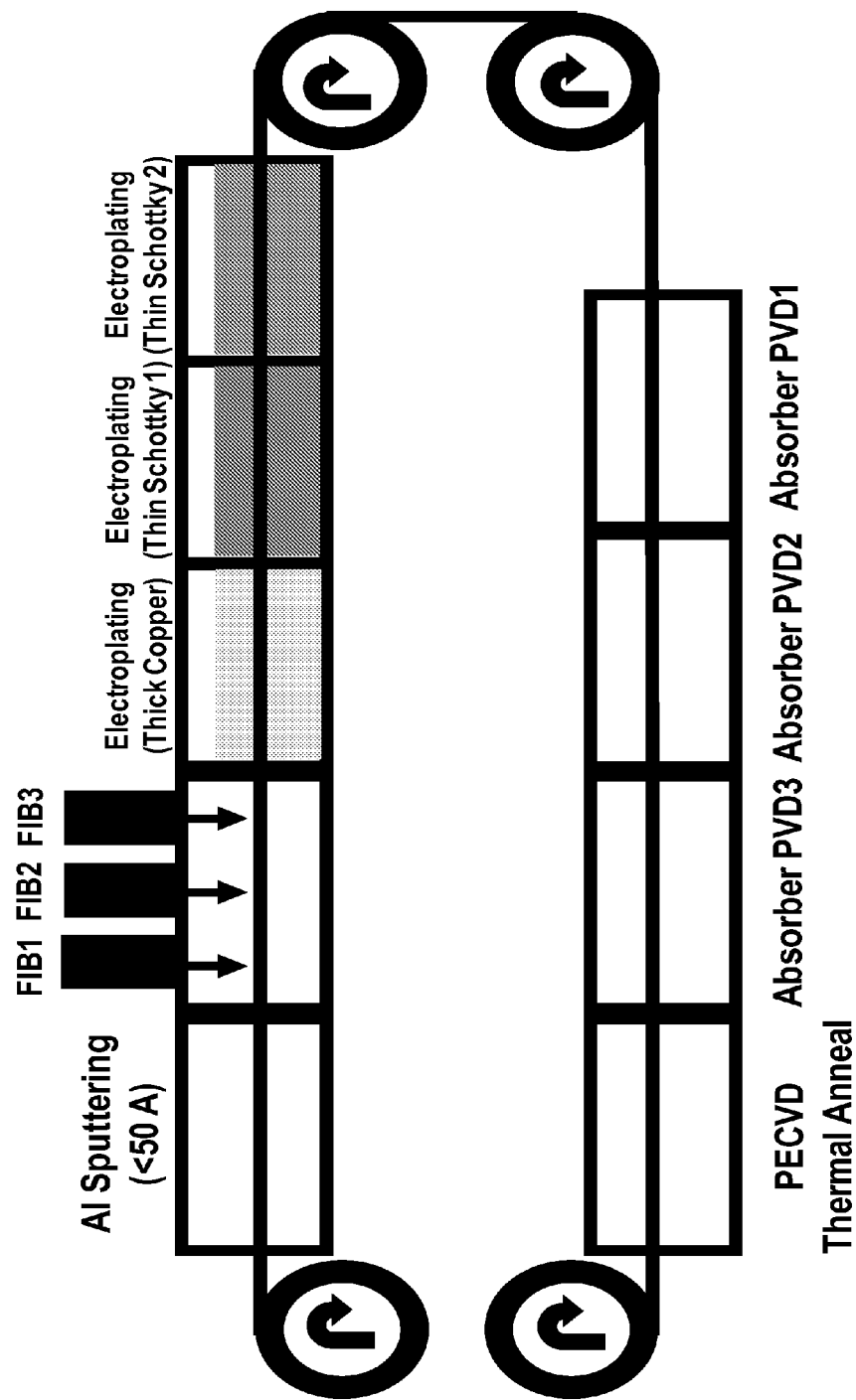
FIG. 3 shows a schematic diagram of a reel-to-reel fab used for fabrication of the solar cells.

The photovoltaic cell architecture described above may be manufactured using an efficient reel-to-reel cell fab as shown in FIG. 3. The process flow is detailed below (See FIGS. 3 through 11 for the embodiment with straight inerdigitated metallization fingers).

FIG. 3 shows a schematic diagram of a reel-to-reel fab used for fabrication of the solar cells of this disclosure. Note that the optional pin stamping process (and liquid spray coating and curing processes on a flexible metallic substrate) are not shown in this schematic diagram.

Figure 4:
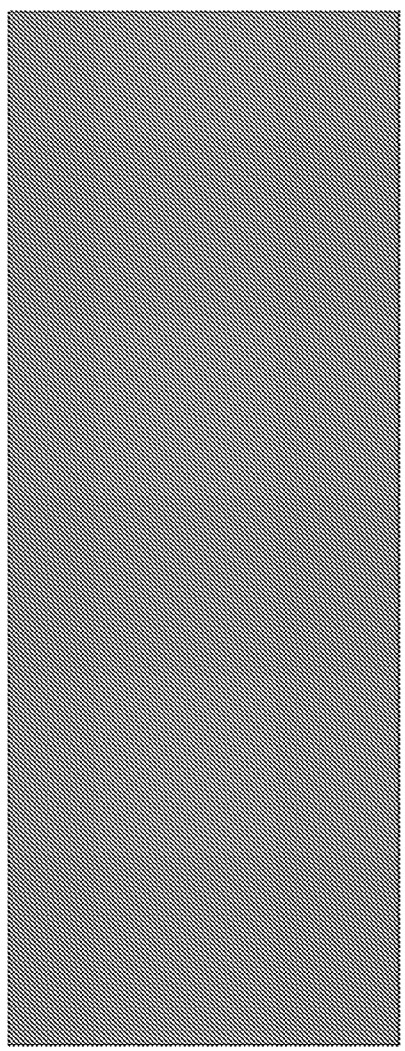
FIG. 4 shows a schematic diagram of a section of the flexible substrate moving between the input and output fab rollers.

FIG. 4 shows a schematic diagram of a section of the flexible substrate moving between the input and output fab rollers.

Figure 5:
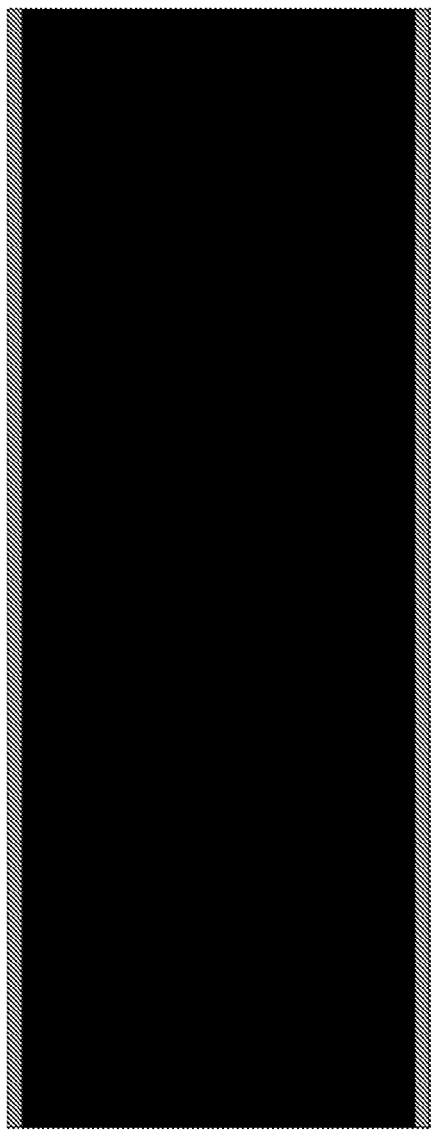
FIG. 5 shows a schematic diagram of a section of the flexible substrate after sputter deposition of a metal layer.

FIG. 5 shows a schematic diagram of a section of the flexible substrate after sputter deposition of an ultrathin metal (e.g., <5 nm aluminum) layer. Note that this substrate may first pass through a stamping station to stamp an array of regularly distributed pins (or pillars) on the flexible substrate (pins not shown). The flexible substrate may be made of a metallic layer such as copper or stainless steel. After the stamping process it may be coated (e.g., spray-coated) with a thin layer of insulating polymer layer which is subsequently cured. The ultrathin aluminum deposition process (e.g., by PVD/plasma sputtering) is performed after the above-mentioned stamping and insulator coating processes. If the substrate being stamped is made of an insulating material, then the liquid spray coating and curing of the insulator layer is not required.

FIG. 6 shows a schematic diagram of a section of the flexible substrate after sputter deposition of an ultrathin metal (e.g., <5 nm aluminum) layer, and after a first focused oxygen beam (oxygen FIB) process to form a regular array of micron-scale (width of fingers) insulating metal oxide, such as aluminum oxide, insulating lines on the ultrathin metal (e.g., aluminum) coating. This figure shows the resulting interdigitated lines as straight lines. The two cell contacts (for electron and hole collection) are not yet isolated from each other. The stamped pins/pillars (not shown) are aligned and fall within the conductive metallic (e.g., aluminum) fingers. Note that the insulating metal oxide (e.g., aluminum oxide) lines essentially extend across most of the flexible substrate width. Other interdigitated line patterns such as zigzag patterns may be made as well.

FIG. 7 shows a schematic diagram of a section of the flexible substrate after sputter deposition of an ultrathin metal (e.g., <5 nm aluminum) layer, a first focused oxygen beam (oxygen FIB) process to form a regular array of insulating metal oxide (such as aluminum oxide) insulating lines on the ultrathin metal (e.g., aluminum) coating, and a second focused oxygen beam (oxygen FIB) process to complete fabricated of the interdigitated fingers for cell contacts/interconnects. The two cell contacts are now electrically isolated from each other. The regions exposed by this FIB process are shown in small squares. They also represent insulating metal oxide (e.g., AlOx) regions (same as the lines). This figure shows the resulting interdigitated lines as straight lines. The stamped pins/pillars (not shown) are aligned and fall within the conductive metallic (e.g., aluminum) fingers. Note that the insulating metal oxide (e.g., aluminum oxide) lines essentially extend across most of the flexible substrate width. Other interdigitated line patterns such as zigzag patterns may be made as well.

FIG. 8 shows a schematic diagram of a section of the flexible substrate after sputter deposition of an ultrathin metal (e.g., <5 nm aluminum) layer, a first focused oxygen beam (oxygen FIB) process to form a regular array of insulating metal oxide (such as aluminum oxide) insulating lines on the ultrathin metal (e.g., aluminum) coating, a second focused oxygen beam (oxygen FIB) process to complete fabricated of the interdigitated fingers for cell contacts/interconnects, and then a plating process (electroless plating or electroplating) to selectively form a thick (e.g., 1 to 3 µm) layer of high-conductivity copper on the patterned interdigitated metallic fingers. The two cell contacts are electrically isolated from each other. This figure shows the resulting interdigitated lines as straight lines. The stamped pins/pillars (not shown) are aligned and fall within the conductive metallic (e.g., thin aluminum coated with thick copper) fingers. Note that the insulating metal oxide (e.g., aluminum oxide) lines essentially extend across most of the flexible substrate width. Other interdigitated line patterns such as zigzag patterns may be made as well.

FIG. 9 shows a schematic diagram of a section of the flexible substrate after sputter deposition of an ultrathin metal (e.g., <5 nm aluminum) layer, a first focused oxygen beam (oxygen FIB) process to form a regular array of insulating metal oxide (such as aluminum oxide) insulating lines on the ultrathin metal (e.g., aluminum) coating, a second focused oxygen beam (oxygen FIB) process to complete fabricated of the interdigitated fingers for cell contacts/interconnects, a plating process (electroless plating or electroplating) to selectively form a thick (e.g., 1 to 3 µm) layer of high-conductivity copper on the patterned interdigitated metallic fingers, and then after a selective biased electroplating process (electrical bias applied to Cell Contact 1) to plate a thin (e.g., <100 nm) layer of a first Schottky barrier metal material on Cell Contact 1 areas. The two cell contacts are electrically isolated from each other. This figure shows the resulting interdigitated lines as straight lines. The stamped pins/pillars (not shown) are aligned and fall within the conductive metallic (e.g., thin aluminum coated with thick copper) fingers. Note that the insulating metal oxide (e.g., aluminum oxide) lines essentially extend across most of the flexible substrate width. Other interdigitated line patterns such as zigzag patterns may be made as well.

FIG. 10 shows a schematic diagram of a section of the flexible substrate after sputter deposition of an ultrathin metal (e.g., <5 nm aluminum) layer, a first focused oxygen beam (oxygen FIB) process to form a regular array of insulating metal oxide (such as aluminum oxide) insulating lines on the ultrathin metal (e.g., aluminum) coating, a second focused oxygen beam (oxygen FIB) process to complete fabricated of the interdigitated fingers for cell contacts/interconnects, a plating process (electroless plating or electroplating) to selectively form a thick (e.g., 1 to 3 µm) layer of high-conductivity copper on the patterned interdigitated metallic fingers, a selective biased electroplating process (electrical bias applied to Cell Contact 1) to plate a thin (e.g., <100 nm) layer of a first Schottky barrier metal material on Cell Contact 1 areas, and then after another selective biased electroplating process (electrical bias applied to Cell Contact 2) to plate a thin (e.g., <100 nm) layer of a second Schottky barrier metal material on Cell Contact 2 areas. The two cell contacts are electrically isolated from each other. This figure shows the resulting interdigitated lines as straight lines. The stamped pins/pillars (not shown) are aligned and fall within the conductive metallic (e.g., thin aluminum coated with thick copper) fingers. Note that the insulating metal oxide (e.g., aluminum oxide) lines essentially extend across most of the flexible substrate width. Other interdigitated line patterns such as zigzag patterns may be made as well.

FIG. 11 shows a schematic diagram of a section of the flexible substrate after sputter deposition of an ultrathin metal (e.g., <5 nm aluminum) layer, a first focused oxygen beam (oxygen FIB) process to form a regular array of insulating metal oxide (such as aluminum oxide) insulating lines on the ultrathin metal (e.g., aluminum) coating, a second focused oxygen beam (oxygen FIB) process to complete fabricated of the interdigitated fingers for cell contacts/interconnects, a plating process (electroless plating or electroplating) to selectively form a thick (e.g., 1 to 3 µm) layer of high-conductivity copper on the patterned interdigitated metallic fingers, a selective biased electroplating process (electrical bias applied to Cell Contact 1) to plate a thin (e.g., <100 nm) layer of a first Schottky barrier metal material on Cell Contact 1 areas, another selective biased electroplating process (electrical bias applied to Cell Contact 2) to plate a thin (e.g., <100 nm) layer of a second Schottky barrier metal material on Cell Contact 2 areas, and then after deposition (e.g., by PVD) of a semiconductor absorber layer. The two cell contacts are electrically isolated from each other. This figure shows the resulting interdigitated lines as straight lines. The stamped pins/pillars (not shown) are aligned and fall within the conductive metallic (e.g., thin aluminum coated with thick copper) fingers. Note that the insulating metal oxide (e.g., aluminum oxide) lines essentially extend across most of the flexible substrate width. Other interdigitated line patterns such as zigzag patterns may be made as well.

The following figures show the same process flow as above but with interdigitated zigzag-shaped metallization fingers. The schematic diagrams for this alternative cell metallization start with the same diagrams as those shown in FIGS. 4 and 5. The remaining figures for the rest of the process flow are shown below.

FIG. 12 corresponds to FIG. 6 for the straight interdigitated lines. Schematic diagram of a section of the flexible substrate after sputter deposition of an ultrathin metal (e.g., <5 nm aluminum) layer, and after a first focused oxygen beam (oxygen FIB) process to form a regular array of micron-scale (width of fingers) insulating metal oxide, such as aluminum oxide, insulating lines on the ultrathin metal (e.g., aluminum) coating. This figure shows the resulting interdigitated lines as zigzag lines. The two cell contacts (for electron and hole collection) are not yet isolated from each other. The stamped pins/pillars (not shown) are aligned and fall within the conductive metallic (e.g., aluminum) fingers. Note that the insulating metal oxide (e.g., aluminum oxide) lines essentially extend across most of the flexible substrate width. Other interdigitated line patterns such as zigzag patterns may be made as well.

FIG. 13 corresponds to FIG. 7 for the straight interdigitated lines. Schematic diagram of a section of the flexible substrate after sputter deposition of an ultrathin metal (e.g., <5 nm aluminum) layer, a first focused oxygen beam (oxygen FIB) process to form a regular array of insulating metal oxide (such as aluminum oxide) insulating lines on the ultrathin metal (e.g., aluminum) coating, and a second focused oxygen beam (oxygen FIB) process to complete fabricated of the interdigitated fingers for cell contacts/interconnects. The two cell contacts are now electrically isolated from each other. The regions exposed by this FIB process are shown in small squares. They also represent insulating metal oxide (e.g., AlOx) regions (same as the lines). This figure shows the resulting interdigitated lines as zigzag lines. The stamped pins/pillars (not shown) are aligned and fall within the conductive metallic (e.g., aluminum) fingers. Note that the insulating metal oxide (e.g., aluminum oxide) lines essentially extend across most of the flexible substrate width. Other interdigitated line patterns such as zigzag patterns may be made as well.

FIG. 14 corresponds to FIG. 8 for the straight interdigitated lines. Schematic diagram of a section of the flexible substrate after sputter deposition of an ultrathin metal (e.g., <5 nm aluminum) layer, a first focused oxygen beam (oxygen FIB) process to form a regular array of insulating metal oxide (such as aluminum oxide) insulating lines on the ultrathin metal (e.g., aluminum) coating, a second focused oxygen beam (oxygen FIB) process to complete fabricated of the interdigitated fingers for cell contacts/interconnects, and then a plating process (electroless plating or electroplating) to selectively form a thick (e.g., 1 to 3 μm) layer of high-conductivity copper on the patterned interdigitated metallic fingers. The two cell contacts are electrically isolated from each other. This figure shows the resulting interdigitated lines as zigzag lines. The stamped pins/pillars (not shown) are aligned and fall within the conductive metallic (e.g., thin aluminum coated with thick copper) fingers. Note that the insulating metal oxide (e.g., aluminum oxide) lines essentially extend across most of the flexible substrate width. Other interdigitated line patterns such as zigzag patterns may be made as well.

FIG. 15 corresponds to FIG. 9 for the straight interdigitated lines. Schematic diagram of a section of the flexible substrate after sputter deposition of an ultrathin metal (e.g., <5 nm aluminum) layer, a first focused oxygen beam (oxygen FIB) process to form a regular array of insulating metal oxide (such as aluminum oxide) insulating lines on the ultrathin metal (e.g., aluminum) coating, a second focused oxygen beam (oxygen FIB) process to complete fabricated of the interdigitated fingers for cell contacts/interconnects, a plating process (electroless plating or electroplating) to selectively form a thick (e.g., 1 to 3 μm) layer of high-conductivity copper on the patterned interdigitated metallic fingers, and then after a selective biased electroplating process (electrical bias applied to Cell Contact 1) to plate a thin (e.g., <100 nm) layer of a first Schottky barrier metal material on Cell Contact 1 areas. The two cell contacts are electrically isolated from each other. This figure shows the resulting interdigitated lines as zigzag lines. The stamped pins/pillars (not shown) are aligned and fall within the conductive metallic (e.g., thin aluminum coated with thick copper) fingers. Note that the insulating metal oxide (e.g., aluminum oxide) lines essentially extend across most of the flexible substrate width. Other interdigitated line patterns such as zigzag patterns may be made as well.

FIG. 16 corresponds to FIG. 10 for the straight interdigitated lines. Schematic diagram of a section of the flexible substrate after sputter deposition of an ultrathin metal (e.g., <5 nm aluminum) layer, a first focused oxygen FIB) process to form a regular array of insulating metal oxide (such as aluminum oxide) insulating lines on the ultrathin metal (e.g., aluminum) coating, a second focused oxygen beam (oxygen FIB) process to complete fabricated of the interdigitated fingers for cell contacts/interconnects, a plating process (electroless plating or electroplating) to selectively form a thick (e.g., 1 to 3 μm) layer of high-conductivity copper on the patterned interdigitated metallic fingers, a selective biased electroplating process (electrical bias applied to Cell Contact 1) to plate a thin (e.g., <100 nm) layer of a first Schottky barrier metal material on Cell Contact 1 areas, and then after another selective biased electroplating process (electrical bias applied to Cell Contact 2) to plate a thin (e.g., <100 nm) layer of a second Schottky barrier metal material on Cell Contact 2 areas. The two cell contacts are electrically isolated from each other. This figure shows the resulting interdigitated lines as straight zigzag lines. The stamped pins/pillars (not shown) are aligned and fall within the conductive metallic (e.g., thin aluminum coated with thick copper) fingers. Note that the insulating metal oxide (e.g., aluminum oxide) lines essentially extend across most of the flexible substrate width. Other interdigitated line patterns such as zigzag patterns may be made as well.

FIG. 17 corresponds to FIG. 11 for the straight interdigitated lines. Schematic diagram of a section of the flexible substrate after sputter deposition of an ultrathin metal (e.g., <5 nm aluminum) layer, a first focused oxygen beam (oxygen FIB) process to form a regular array of insulating metal oxide (such as aluminum oxide) insulating lines on the ultrathin metal (e.g., aluminum) coating, a second focused oxygen beam (oxygen FIB) process to complete fabricated of the interdigitated fingers for cell contacts/interconnects, a plating process (electroless plating or electroplating) to selectively form a thick (e.g., 1 to 3 μm) layer of high-conductivity copper on the patterned interdigitated metallic fingers, a selective biased electroplating process (electrical bias applied to Cell Contact 1) to plate a thin (e.g., <100 nm) layer of a first Schottky barrier metal material on Cell Contact 1 areas, another selective biased electroplating process (electrical bias applied to Cell Contact 2) to plate a thin (e.g., <100 nm) layer of a second Schottky barrier metal material on Cell Contact 2 areas, and then after deposition (e.g., by PVD) of a semiconductor absorber layer. The two cell contacts are electrically isolated from each other. This figure shows the resulting interdigitated lines as straight lines. The stamped pins/pillars (shown as the ECT and HCT pins) are aligned and fall within the conductive metallic (e.g., thin aluminum coated with thick copper) fingers. Note that the insulating metal oxide (e.g., aluminum oxide) lines essentially extend across most of the flexible substrate width. Other interdigitated line patterns such as zigzag patterns may be made as well.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method to manufacture a Schottky contact photovoltaic energy conversion cell comprising:

using a roll of a flexible substrate material moving between an input substrate feeder and an output substrate receiver through a continuous flow in-line cell factory; and using a sequence of substrate processing tools within said in-line cell factory, said tools comprising physical-vapor deposition, metal plating, and pattern transfer equipment, wherein said material roll goes through the sequence to form interdigitated arrays of Schottky-barrier lines and pillars covered with a semiconductor absorber layer, the sequence comprising the steps:

connecting a first array of a plurality of closely-spaced microscale pillars to a first electrical cell contact, said pillars and said contact are formed of (or having a top) layer of a first Schottky metal material with a work function selected for efficiently collecting photogenerated electrons;

connecting a second array of a plurality of closely-spaced microscale pillars to a second electrical cell contact, said pillars and said contact are formed of (or having a top) layer of a second Schottky metal material with a work function selected for efficiently collecting photogenerated holes; and depositing a semiconductor absorber thin-film layer covering said first and second contacts and filling spaces among said pillars, for creating photogenerated electrons and holes.

2. The method of claim 1, wherein said interdigitated arrays of Schottky-barrier lines and pillars are formed in a pattern that alternates said first array of a plurality of closely-spaced microscale pillars and said second array of a plurality of closely-spaced microscale pillars.

3. The method of claim 1, wherein said interdigitated arrays of Schottky-barrier lines and pillars are formed in straight line patterns.

4. The method of claim 1, wherein said interdigitated arrays of Schottky-barrier lines and pillars are formed in zigzag line patterns.

5. The method of claim 1, wherein said first array of a plurality closely-spaced microscale pillars are symmetrically surrounded by said second array of a plurality of closely-spaced micro-pillars and vice versa.

6. The method of claim 1, wherein said first array of a plurality of closely-spaced microscale pillars and said second array of a plurality of closely-spaced micro-pillars are spaced such that there is a large enough built-in electric field $E_{bi}$ that will sweep photo-generated carriers towards said first and second electrical cell contacts for collection.

\* \* \* \* \*